(12) United States Patent  (10) Patent No.: US 8,067,963 B2
Imai et al.  (45) Date of Patent: Nov. 29, 2011

(54) SENSE-AMPLIFIER CONTROL CIRCUIT AND CONTROLLING METHOD OF SENSE AMPLIFIER

(75) Inventors: Seiro Imai, Tokyo (JP); Tsuneaki Fuse, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 12/565,478

(22) Filed: Sep. 23, 2009

(65) Prior Publication Data

US 2010/0090725 A1   Apr. 15, 2010

(30) Foreign Application Priority Data

Oct. 10, 2008 (JP) .................................. 2008-263955

(51) Int. Cl.
*G01R 19/00* (2006.01)
(52) U.S. Cl. .......................................................... 327/51
(58) Field of Classification Search ........................ None
See application file for complete search history.

(56) References Cited

U.S. PATENT DOCUMENTS 7,764,558 B2 * 7/2010 Abe et al. ...................... 365/207
2005/0146972 A1 * 7/2005 Hong ............................. 365/227

FOREIGN PATENT DOCUMENTS

JP   2005-285161   10/2005

* cited by examiner

*Primary Examiner* — Lincoln Donovan
*Assistant Examiner* — Sibin Chen
(74) *Attorney, Agent, or Firm* — Oblon, Spivak, McClelland, Maier & Neustadt, L.L.P.

(57) ABSTRACT

A sense amplifier control circuit includes an initial-voltage setting circuit configured to set a control signal to an initial voltage, the control signal controlling a sensing operation of a sense amplifier, and a control-signal-level adjusting circuit configured to first change a voltage level of the control signal from the initial voltage to a voltage level at which the sense amplifier can execute a current sensing, and is configured to second change, after a predetermined time elapses, the voltage level at which the sense amplifier can execute the current sensing to a voltage level at which the sense amplifier can execute a voltage sensing.

12 Claims, 11 Drawing Sheets

SENSE-AMPLIFIER CONTROL CIRCUIT AND CONTROLLING METHOD OF SENSE AMPLIFIER

CROSS-REFERENCE TO RELATED APPLICATIONS

This application is based upon and claims the benefit of priority from the prior Japanese Patent Application No. 2008-263955, filed Oct. 10, 2008, the entire contents of which are incorporated herein by reference.

BACKGROUND OF THE INVENTION

1. Field of the Invention

The present invention relates to a sense-amplifier control circuit for a current-sensing sense amplifier that performs voltage sensing after current sensing and a controlling method of the sense amplifier.

2. Description of the Related Art

In recent years, low voltage operation has been demanded for semiconductor devices. In addition, stable, low voltage operation has been demanded for sense amplifiers used for fetching data from a memory-cell array such as a DRAM and a flash memory. High speed operation is also needed for some sense amplifiers used for certain purposes.

For example, Japanese Patent Application Publication No. 2000-285161 proposes a current-sensing sense amplifier that supports a low-voltage operation.

However, the sense-amplifier control circuit disclosed in Japanese Patent Application Publication No. 2000-285161 suffers from certain drawbacks recognized by the present inventors. With some kinds of configurations of sense-amplifier control circuits, the transition from the current sensing to the voltage sensing occurs while the current sensing has not been executed sufficiently. In this case, if the state of an initial voltage of an output terminal is not normal, and an operation error may occur, that is, the output logic may become opposite to the proper logic. A longer current-sensing period to avoid the occurrence of operation errors causes a problem such as making high-speed operation difficult.

A current-sensing sense amplifier with an equalizing function has been proposed for the purpose of reducing the occurrence of operation errors. In this kind of a sense amplifier, the initial voltages of the output terminals are equalized and then the current sensing is performed. Accordingly, the occurrence of the operation errors caused by an abnormal initial voltage can be reduced. There may be, however, cases in which the equalization (pre-charging) is insufficient. Accordingly, it is still possible that the above-described operation errors occur.

SUMMARY OF THE INVENTION

A semiconductor memory device according to an exemplary aspect of the present invention includes: an initial-voltage setting circuit configured to set a control signal to an initial voltage, the control signal controlling a sensing operation of a sense amplifier, and a control-signal-level adjusting circuit configured to first change a voltage level of the control signal from the initial voltage to a voltage level at which the sense amplifier can execute a current sensing, and is configured, after a predetermined time elapses, to second change the voltage level at which the sense amplifier can execute the current sensing to a voltage level at which the sense amplifier can execute a voltage sensing.

A controlling method of a sense amplifier according to an exemplary aspect of the present invention includes: setting a control signal to an initial voltage, the control signal controlling a sensing operation of a sense amplifier, and first changing a voltage level of the control signal from the initial voltage to a voltage level at which the sense amplifier can execute a current sensing, and second changing, after a predetermined time elapses, the voltage level at which the sense amplifier can execute the current sensing to a voltage level at which the sense amplifier can execute a voltage sensing.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF PREFERRED EMBODIMENTS

Figure 1:
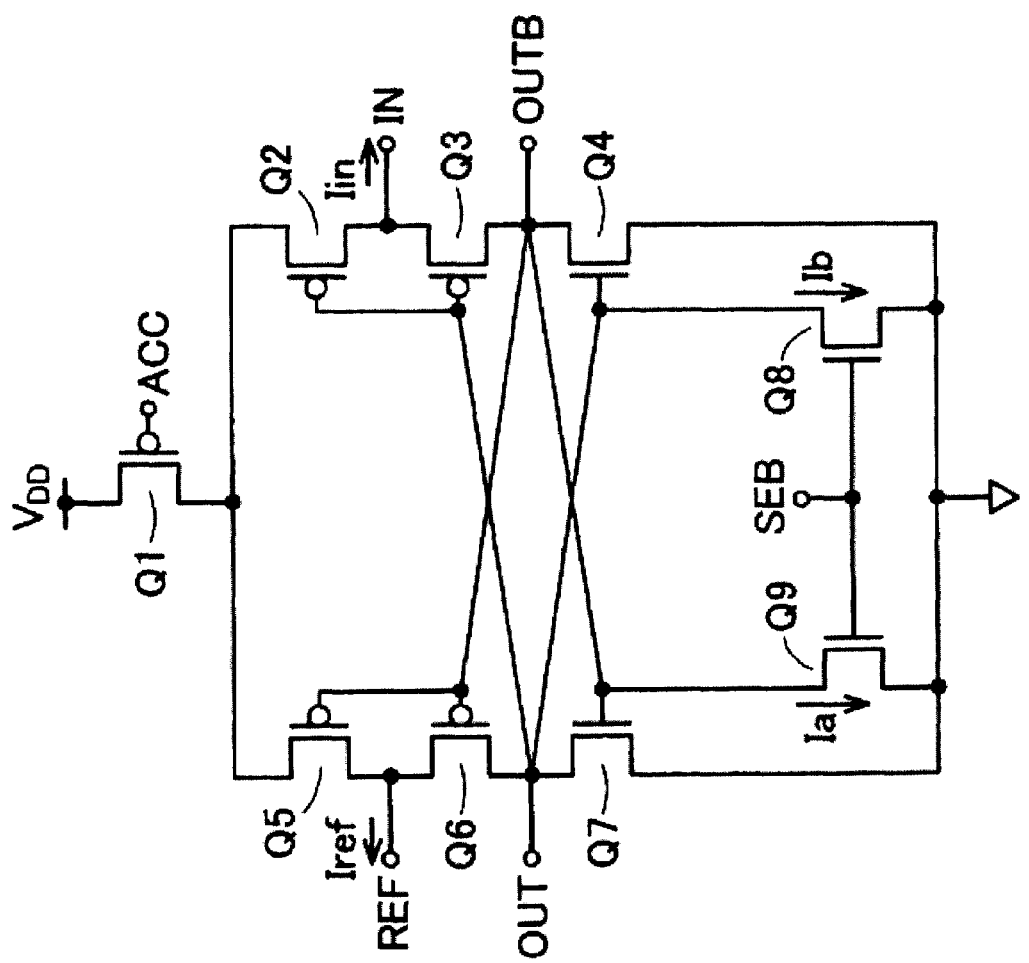
FIG. 1 is a circuit diagram showing an example of a sense amplifier to which the present invention can be applied.

Various objects, features and attendant advantages of the present invention will be more fully appreciated from the following detailed description when considered in connection with the accompanying drawings in which like reference characters designate like or corresponding parts throughout the several views.

Sense-amplifier control circuits according to some embodiments of the present invention will be described in detail below by referring to the drawings.

First, a description will be given of the operation of a current-sensing sense amplifier (hereafter, simply referred to as a "sense amplifier") that can be controlled by sense-amplifier control circuits according to embodiments of this invention.

FIG. 1 is a circuit diagram showing an example of a sense amplifier. The sense amplifier shown in FIG. 1 includes: a PMOS transistor Q1 that constitutes a current source; PMOS transistors Q2 and Q3, and an NMOS transistor Q4, all of which are cascadingly connected between the drain of the transistor Q1 and a ground terminal; PMOS transistors Q5 and Q6, and an NMOS transistor Q7, all of which are, likewise, cascadingly connected between the drain of the transistor Q1 and the ground terminal; an NMOS transistor Q8 that is connected between the gate of the NMOS transistor Q4 and the ground terminal; and an NMOS transistor Q9 that is connected between the gate of the NMOS transistor Q7 and the ground terminal.

A bit-line signal IN of a memory-cell array is input into a connection node of the drain of the transistor Q2 and the source of the transistor Q3. A reference bit-line signal REF is input into a connection node of the drain of the transistor Q5 and the source of the transistor Q6.

An output signal OUT is output from a connection node of the drain of the transistor Q6 and the drain of the transistor Q7. An output signal OUTB is output from a connection node of the drain of the transistor Q3 and the drain of the transistor Q4. The output signal OUT is supplied to the gates of the transistors Q2 to Q4 and to the drain of the transistor Q8. The output signal OUTB is supplied to the gates of the transistors Q5 to Q7 and to the drain of the transistor Q9.

An SEB signal, which will be described in detail later, is supplied to the gates of the transistors Q8 and Q9. A transition of the SEB signal from high to low triggers the sensing operation of the sense amplifier shown in FIG. 1. The sense amplifier shown in FIG. 1 performs current sensing while the voltage level of the SEB signal is high, and performs voltage sensing when the voltage level of the SEB signal becomes low.

Figure 2:
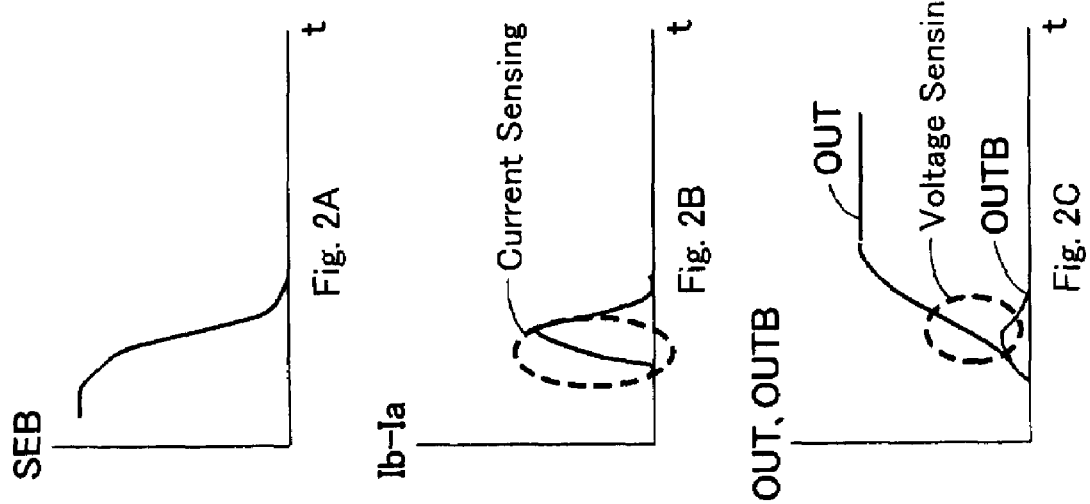
FIGS. 2A-2C are charts for describing the relationship among the voltage level of an SEB signal, the current sensing, and the voltage sensing.

FIGS. 2A-2C are charts for describing the relationship among the voltage level of the SEB signal, the current sensing, and the voltage sensing. FIG. 2A is a voltage-waveform chart for the SEB signal. FIG. 2B is a current-waveform chart illustrating the difference between currents Ib and Ia (i.e., Ib−Ia), in which Ib denotes the current that flows between the drain and the source of the transistor Q8 and Ia denotes the current that flows between the drain and the source of the transistor Q9. FIG. 2C is a voltage-waveform chart for the output signals OUT and OUTB. FIGS. 2A-2C are based on an assumption that Iin>Iref, wherein Iin denotes the current of the bit-line signal and Iref denotes the current of the reference bit-line signal.

The SEB signal is high in the initial state (before starting the sensing operation). Accordingly, both of the transistors Q8 and Q9 shown in FIG. 1 are on, so that the currents Ib and Ia are substantially equal to each other. At this moment, both of the output signals OUT and OUTB are low. Accordingly, all of the transistors Q2, Q3, Q5, and Q6 are on whereas both of the transistors Q4 and Q7 are off. Consequently, a part of the current from the transistor Q1 that constitutes the current source flows in the bit-line direction as the bit-line signal IN, whereas another part of the current from the transistor Q1 passes through the transistors Q3 and Q9 and reaches the ground terminal. Likewise, a part of the current from the transistor Q1 flows in the reference bit-line direction as the reference bit-line signal REF, whereas another part of the current from the transistor Q1 passes through the transistors Q6 and Q8 and reaches the ground terminal.

Then, if the voltage level of the SEB signal is gradually lowered, both of the transistors Q8 and Q9 act so as to be turned off and the drain-source resistance of each of the transistors Q8 and Q9 becomes higher. Accordingly, it becomes more difficult for the current to flow between the drain and the source of each of the transistors Q8 and Q9. The difference between the current Ib that flows through the transistor Q8 and the current Ia that flows through the transistor Q9 (i.e., Ib−Ia) becomes greater than the difference between the current Iin of the bit-line signal and the current Iref of the reference bit-line signal (i.e., Iin−Iref). This action is known as current sensing. In FIG. 2B, since Iin>Iref, the current sensing gradually increases the difference (Ib−Ia).

If the voltage level of the SEB signal is further lowered, the current Ib becomes significantly greater than the current Ia and the drain-source resistance of each of the transistors Q8 and Q9 becomes even higher. Accordingly, the gate voltage level of the transistor Q4, that is the voltage level of the output signal OUT, becomes higher, so that the transistor Q4 acts so as to be turned on. Consequently, the voltage level of the output signal OUTB becomes lower so as to increase, gradually, the voltage-level difference between the output signals OUT and OUTB. This action is known as voltage sensing. In FIG. 2C, since Iin>Iref, the voltage-level difference thus amplified makes the output signal OUT high and also makes the output signal OUTB low. The logic is determined as such.

Figure 3:
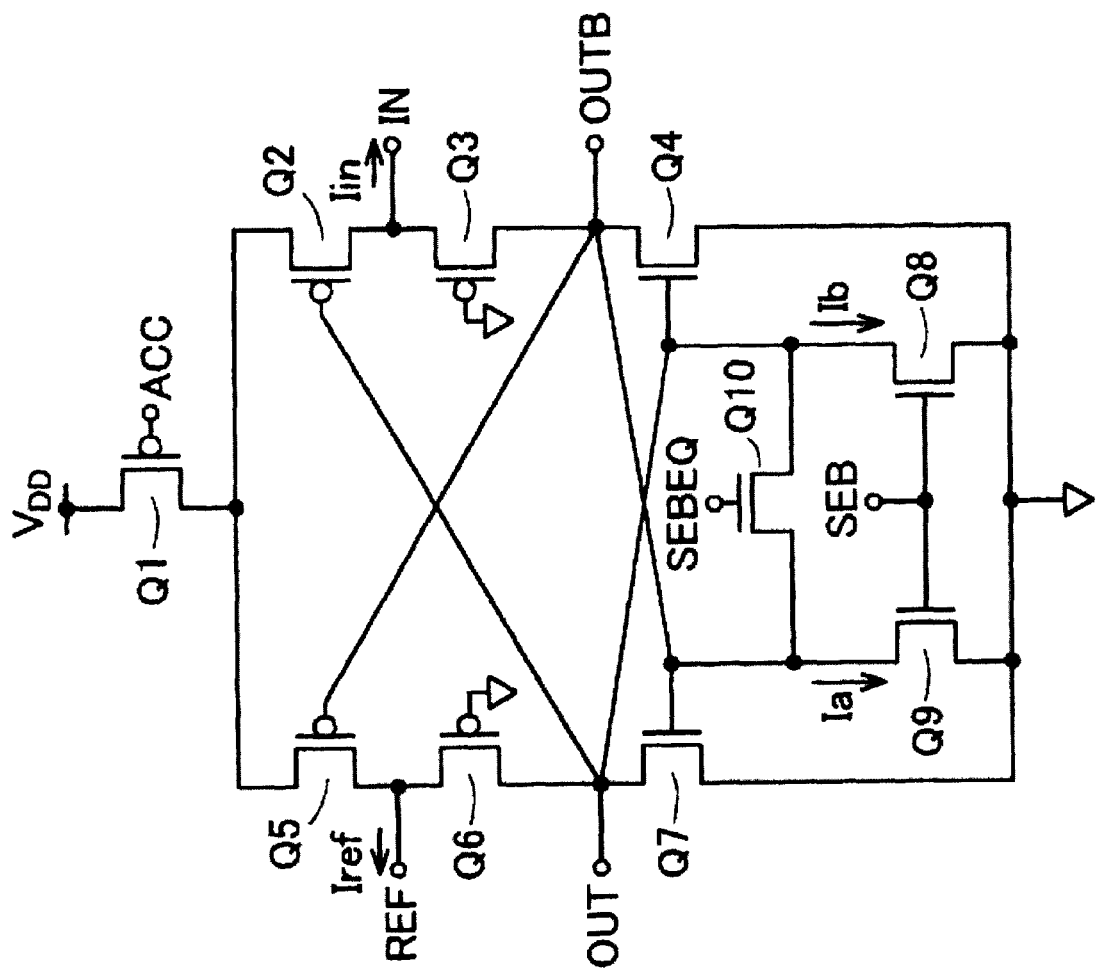
FIG. 3 is a circuit diagram showing an example of a sense amplifier with an equalizing function to which the present invention can be applied.

The sense amplifier shown in FIG. 1 may also have an equalizing function. FIG. 3 is a circuit diagram showing an example of a sense amplifier with an equalizing function. The sense amplifier shown in FIG. 3 includes not only the circuit configuration shown in FIG. 1 but also an NMOS transistor Q10 that is connected between the drain of the transistor Q8 and the drain of the transistor Q9. The sense amplifier shown in FIG. 3 makes an equalizing signal (hereafter referred to as "SEBEQ signal") high before starting a sensing operation so that the voltage level of the output signal OUT and that of the output signal OUTB become equal to each other. This action is known as equalizing. Then, if the SEBEQ signal is made low, the equalizing is cancelled. After that, as in the above-described case, if the high SEB signal is lowered, both the current sensing and the voltage sensing are performed, so that the logic of the output signal OUT and the output signal OUTB is determined. The reason why the equalizing is performed before the start of the sensing operation is that starting the current sensing after the voltage level of the output signal OUT is made equal to that of the output signal OUTB prevents the current sensing from being performed in the opposite electric-potential direction to the proper direction.

As has been described thus far, each of the sense amplifiers shown in FIG. 1 and FIG. 3 performs the current sensing and then the voltage sensing in accordance with the voltage level of the SEB signal. Accordingly, it is important to set, appropriately, the voltage level of the SEB signal. The embodiments, which will be described in detail below provide an optimal-timing control on the voltage level of the SEB signal.

Figure 4:
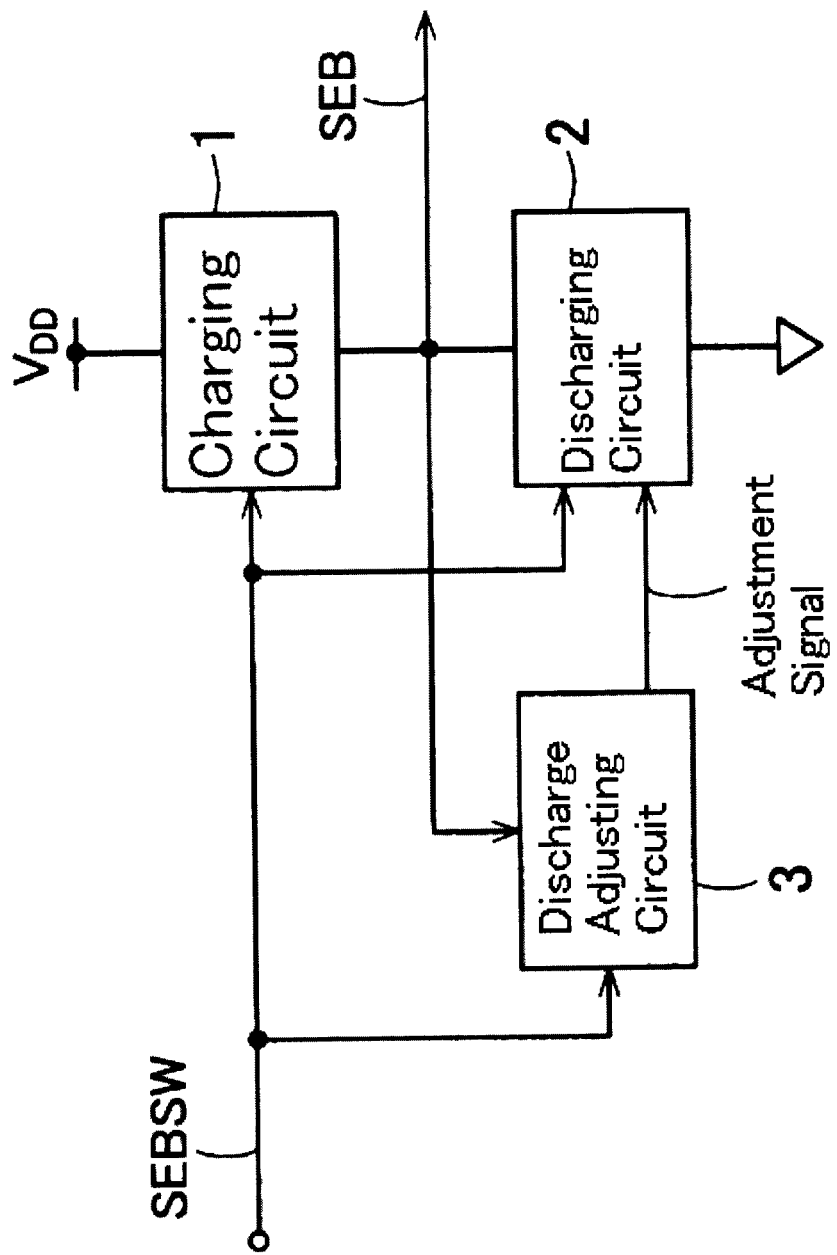
FIG. 4 is a block diagram illustrating a general configuration of a sense-amplifier control circuit according to a first embodiment of the present invention.

FIG. 4 is a block diagram illustrating a general configuration of the sense-amplifier control circuit according to a first embodiment of the present invention. The sense-amplifier control circuit shown in FIG. 4 generates, for example, an SEB signal (control signal) to be supplied to the sense amplifier shown in FIG. 1.

The sense-amplifier control circuit shown in FIG. 4 receives an SEBSW signal generated either from an external point or by another circuit provided internally. In synchronization with the SEBSW signal, the sense-amplifier control circuit shown in FIG. 4 generates an SEB signal to control the sensing operation of the sense amplifier. The SEB signal thus generated is supplied to a sense amplifier, such as shown in FIG. 1 or FIG. 3.

The sense-amplifier control circuit shown in FIG. 4 includes: a charging circuit (initial-voltage setting circuit) 1 to raise the voltage level of the SEB signal; a discharging circuit (control-signal-level adjusting circuit) 2 to lower the voltage level of the SEB signal; and a discharge adjusting circuit (adjusting circuit) 3 to adjust the speed for lowering the voltage level of the SEB signal.

The SEBSW signal that controls the operation of the sense-amplifier control circuit is input into the charging circuit 1, the discharging circuit 2, and the discharge adjusting circuit 3. The SEB signal is output from the charging circuit 1 and the discharging circuit 2, and is input into the discharge adjusting circuit 3. An adjustment signal that is output from the discharge adjusting circuit 3 is input into the discharging circuit 2. More than one adjustment signal may also be provided.

Figure 5:
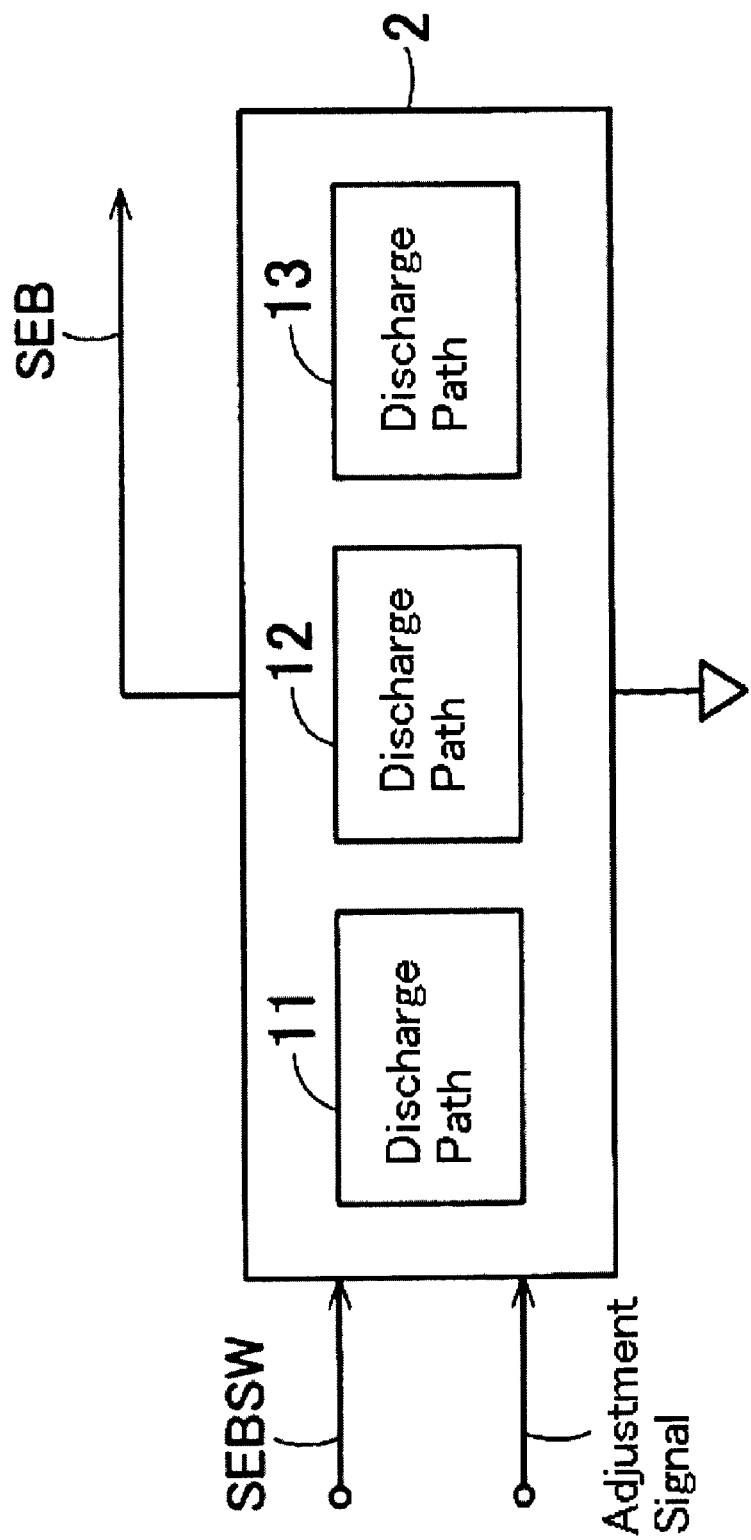
FIG. 5 is a diagram showing an example of an internal configuration of a discharging circuit 2 shown in FIG. 4.

FIG. 5 is a diagram showing an example of an internal configuration of the discharging circuit 2 shown in FIG. 4. The discharging circuit 2 shown in FIG. 5 includes plural discharge paths 11 to 13. The discharging circuit 2 shown in FIG. 5 lowers the voltage level of the SEB signal in response to either the SEBSW signal or the adjustment signal. Each of the plural discharge paths 11 to 13 may be totally independent of the other discharge paths, or may include a part of another one of the plural discharge paths 11 to 13. The number of discharge paths also does not have to be limited to three.

Figure 6:
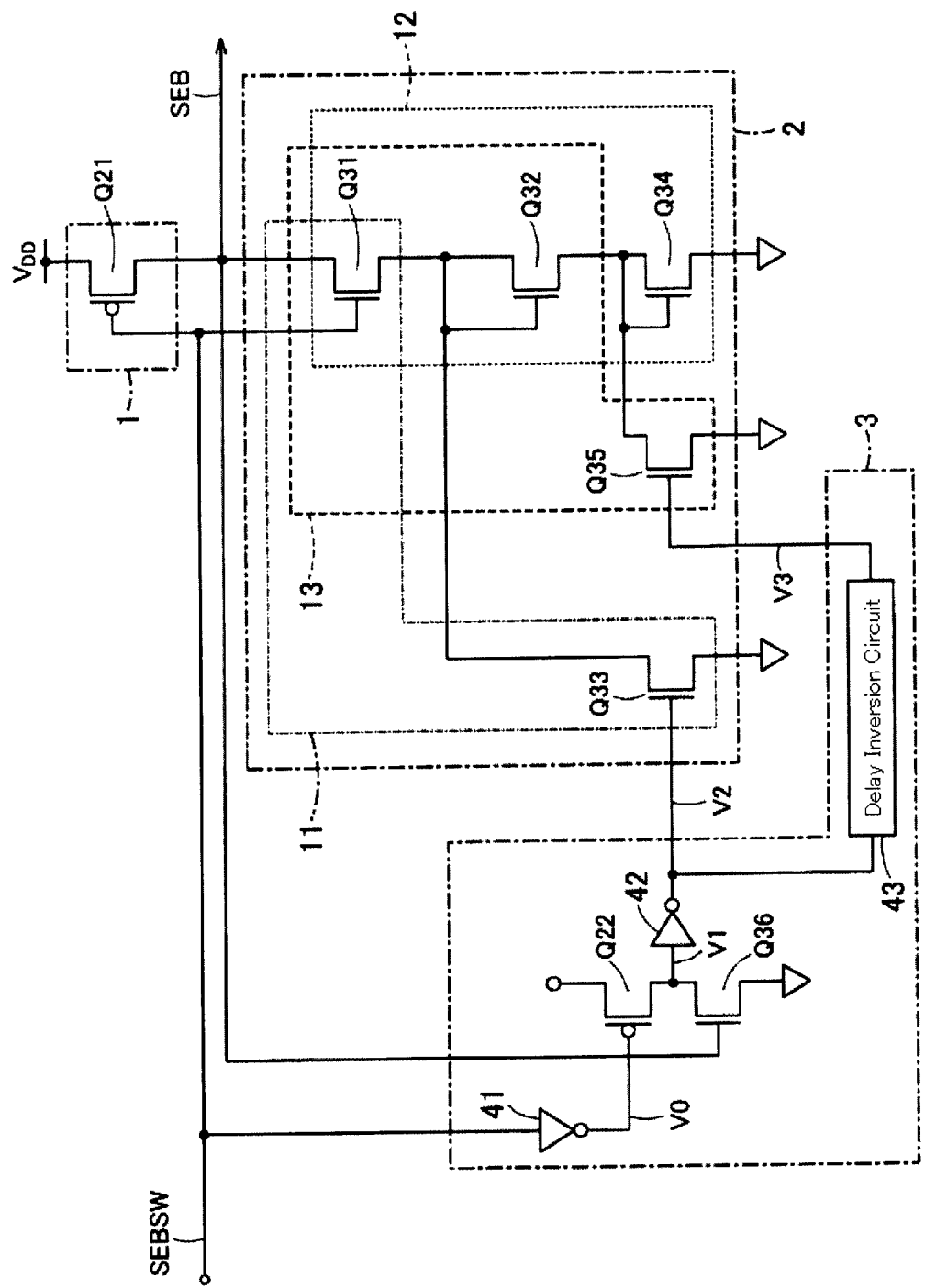
FIG. 6 is a circuit diagram showing an example of a sense-amplifier control circuit shown in FIG. 4 and FIG. 5 and including a MOS transistor.

FIG. 6 is a circuit diagram showing an example of a sense-amplifier control circuit shown in FIG. 4 and FIG. 5 and including a MOS transistor.

The charging circuit 1 includes a PMOS transistor Q21 that is connected between a power-supply terminal VDD and an SEB-signal terminal. The transistor Q21 is turned on when the SEBSW signal input into its gate is low. Then, the transistor Q21 in the on state raises the voltage level of the SEB signal, that is, the voltage level of its drain, up to the power-supply voltage VDD (initial voltage).

The discharging circuit 2 includes the first discharge path 11 (the first path), the second discharge path 12 (the second path), and the third discharge path 13 (the third path) that are described above.

The first discharge path 11 includes an NMOS transistor Q31 and an NMOS transistor Q33, both of which are cascadingly connected between the drain of the transistor Q21 and a ground terminal. An adjustment signal V2 output from the discharge adjusting circuit 3 is supplied to the gate of the transistor Q33. If the adjustment signal V2 is high and at the same time the SEBSW signal is also high, the transistors Q31 and Q33 are on. Consequently, the voltage level of the SEB signal is relatively rapidly lowered.

The second discharge path 12 includes the NMOS transistor Q31, an NMOS transistor Q32, and an NMOS transistor Q34, all of which are cascadingly connected between the drain of the transistor Q21 and a ground terminal. The transistors Q32 and Q34 serve as resistors (impedance elements). When it is difficult for the current to flow through the first discharge path 11, the current flows through the transistors Q31, Q32, and Q34 of the second discharge path 12. Consequently, the voltage level of the SEB signal can be lowered relatively more gradually.

The third discharge path 13 includes the NMOS transistor Q31, the NMOS transistor Q32, and an NMOS transistor (a second transistor) Q35, all of which are cascadingly connected between the drain of the transistor Q21 and a ground terminal. An adjustment signal V3 output from the discharge adjusting circuit 3 is supplied to the gate of the transistor Q35. If the adjustment signal V3 is high and at the same time the SEBSW signal is high, the transistors Q31, Q32, and Q35 are on. Consequently, the voltage level of the SEB signal is lowered relatively rapidly.

As just been described above, in the discharging circuit 2, the first discharge path 11, the second discharge path 12, and the third discharge path 13 share the transistor Q31. In addition, the second discharge path 12 and the third discharge path 13 share the transistor Q32.

The discharge adjusting circuit 3 includes: a first inverter 41; a second inverter 42; a PMOS transistor Q22 and an NMOS transistor Q36, both of which are cascadingly connected between the power-supply terminal VDD and a ground terminal; and a delay inversion circuit (delay circuit) 43. The first inverter 41 receives the SEBSW signal and outputs an inversion signal V0 of the received SEBSW signal. This inversion signal V0 is input into the gate of the transistor Q22. The second inverter 42 receives a signal V1 from the connection node of the transistors Q22 and Q36 and outputs an inversion signal V2 of the received signal V1. The delay inversion circuit 43 outputs a signal V3 that is created by delaying the signal V2 by a certain delay time $\tau$ and by inverting the resultant signal. For example, CMOS inverters of an odd number of stages may serve as the delay inversion circuit 43.

As just been described above, the discharge adjusting circuit 3 generates the signals V2 and V3 as adjustment signals, and supplies the signals V2 and V3 to the discharging circuit 2. In the following description of this disclosure, the signal V2 will be referred to as the first adjustment signal whereas the signal V3 will be referred to as the second adjustment signal.

Figure 7:
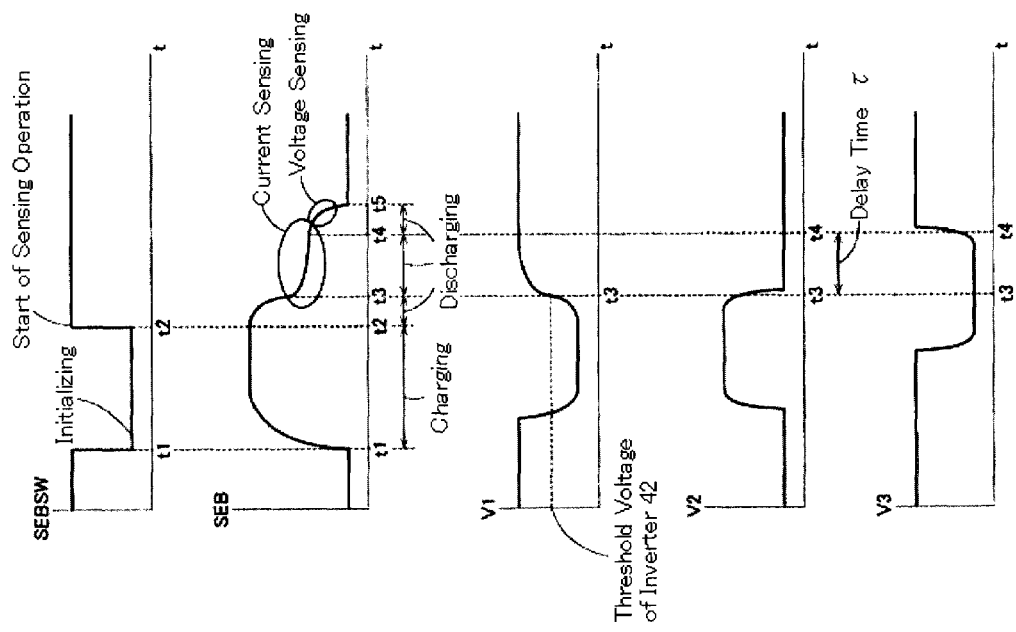
FIG. 7 illustrates voltage-waveform charts for various points indicated in FIG. 6.

FIG. 7 illustrates voltage-waveform charts for various points indicated in FIG. 6. In FIG. 7, the horizontal axis of each graph represents time whereas the vertical axes of the graphs represent the voltage levels for their respective points. The operation of the sense-amplifier control circuit shown in FIG. 6 will be described below by referring to FIG. 7.

To begin with, when the SEBSW signal is initialized to be low (at time t1), the transistor Q21 is turned on and the SEB signal becomes high so as to have an initial voltage (during charging period t1 to t2). During this period, the transistor Q36 in the discharge adjusting circuit 3 is on, the signal V2 output from the inverter 42 is high, and the transistor Q33 is on. Note that, since the transistor Q31 is off, the first to the third discharge paths 11 to 13 in the discharging circuit 2 are cut off.

Then, if the SEBSW signal is changed to be high (at time t2), the transistor Q21 is turned off, and the operation to raise the voltage level of the SEB signal is finished. Thus, the sensing operation starts. At that moment, the transistor Q22 in the discharge adjusting circuit 3 is turned on, so that the input voltage level of the inverter 42 rises. Immediately after the SEBSW signal is changed to be high, the input voltage level of the inverter 42 does not exceed a threshold voltage. Accordingly, the output logic of the inverter 42 is not inverted, so that the transistor Q33 continues to be in the on state. In addition, since the SEBSW signal is high, the transistor Q31 is also turned on. Accordingly, the current flows mainly through the transistors Q31 and Q33, that is, through the first discharge path 11, so that the voltage level of the SEB signal is lowered relatively rapidly (during discharging period t2 to t3).

When the SEB signal is lowered down to an intermediate voltage between the high level and the low level, the logic of the signal V2 output from the inverter 42 is inverted to be low. Accordingly, the transistor Q33 is turned off. Thus, the first discharge path 11 is cut off. Thus, instead of flowing through the transistor Q33, the current that flows through the transistor Q31 flows through the transistors Q32 and Q34 in the second discharge path 12. The transistors Q32 and Q34 serve as resistors, so that the current that flows therethrough is not very large. Consequently, the voltage level of the SEB signal is relatively gradually lowered (during discharging period t3 to t4). During this period t3 to t4, the sense amplifier performs the current sensing.

As FIG. 7 shows, the changing in the SEB voltage during the discharging period t3 to t4 is slower than the corresponding changing during the discharging period t2 to t3 or than that during the discharging period t4 to t5, which will be described later. A large change in the SEB voltage during the discharging period t3 to t4 makes it impossible to secure a sufficient current-sensing period. Accordingly, as just described above, abnormal initial voltages of the output signals of the sense amplifier (the output signals OUT and OUTB in FIG. 1 and FIG. 3) may cause an operation error. In contrast, as in this embodiment, the second discharge path 12 that gradually lowers the SEB voltage makes the change in the SEB voltage smaller during the discharging period t3 to t4. Accordingly, a sufficient current-sensing period can be secured and the occurrence of operation errors can be reduced.

Subsequently, at a time when a delay time τ has elapsed since the signal V2 was changed to be low, the output signal V3 of the delay inversion circuit 43 is changed to be high. Accordingly, the transistor Q35 is turned on and the transistors Q31, Q32, and Q35—i.e., the third discharge path 13—lower, relatively rapidly, the voltage level of the SEB signal (during discharging period t4 to t5). When the SEB signal gets close to the low level, the sense amplifier becomes capable of performing the voltage sensing.

Note that the length of the delay time τ can be adjusted by, for example, forming the delay inversion circuit 43 with an appropriate number of MOS-inverter stages. An appropriate delay time τ set by the delay inversion circuit 43 allows a current-sensing period of a necessary and sufficient length to be secured, thereby preventing operation errors of the sense amplifier from taking place.

As described thus far, in the first embodiment, after the start of the sensing operation, the voltage level of the SEB signal is, firstly, lowered down to the above-mentioned intermediate level relatively rapidly by first discharge path 11. Accordingly, the current sensing can be started rapidly. Then, until the delay time τ elapses, the second discharge path 12 relatively gradually lowers the voltage level of the SEB signal. Accordingly, a necessary and sufficient current sensing executable period can be secured. In addition, after the delay time τ elapses, the third discharge path 13 relatively rapidly lowers the voltage level of the SEB signal. Accordingly, a quick transition to the voltage sensing is possible. Specifically, the voltage level of the SEB signal is rapidly lowered by the discharge adjusting circuit 3 with three stages, so that both the current-sensing period and the voltage-sensing period can be optimized. Consequently, the operation errors of the sense amplifier can be avoided and at the same time a high-speed operation can be accomplished.

The discharging circuit 2 of the first embodiment includes three discharge paths, but modifications to change the number of discharge paths can be implemented. Providing only two discharge paths is a characteristic feature of a second embodiment of the present invention, which will be described below.

Figure 8:
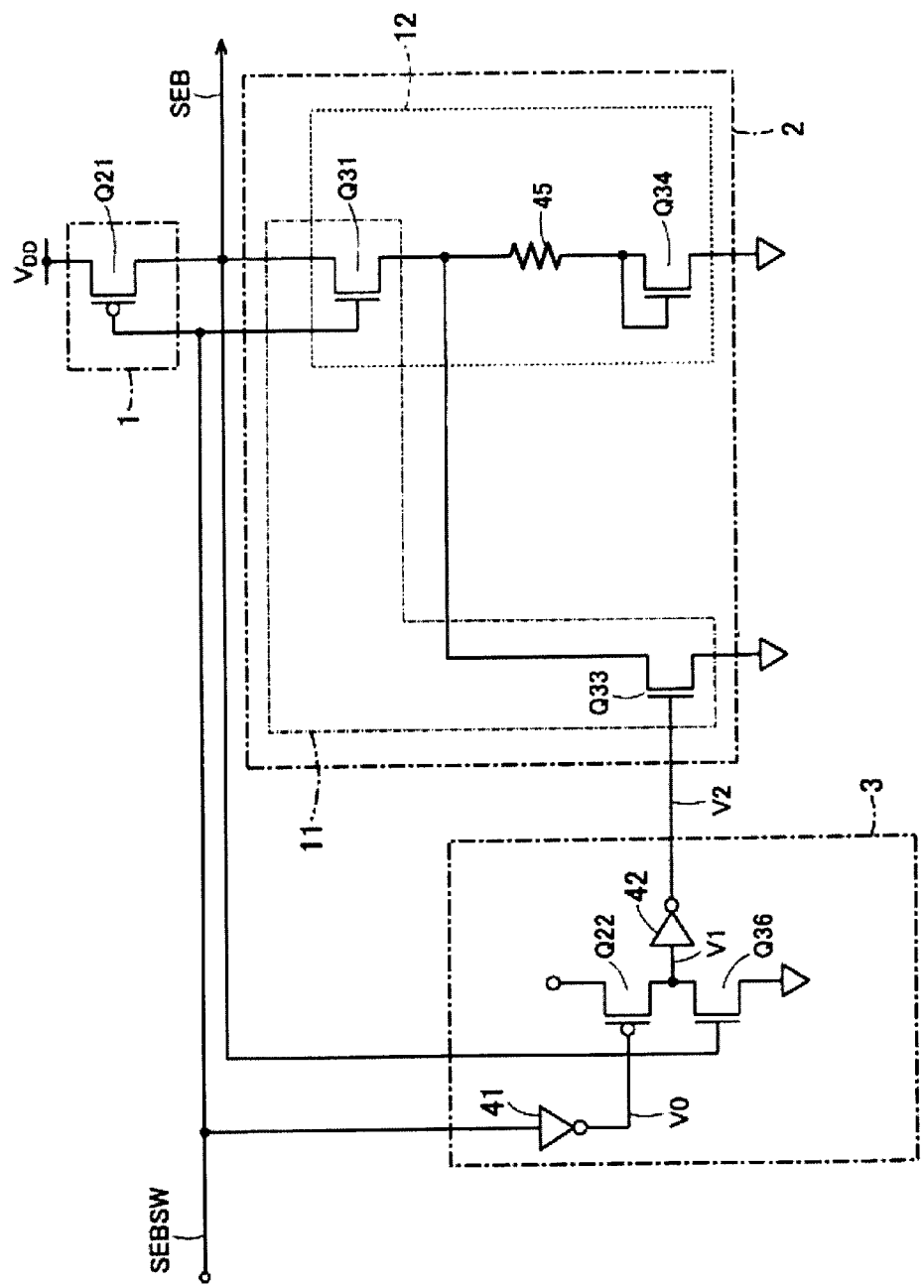
FIG. 8 is a circuit diagram illustrating a sense-amplifier control circuit according to a further embodiment of the present invention.

FIG. 8 is a circuit diagram illustrating a sense-amplifier control circuit according to the second embodiment of the present invention. Components in FIG. 8 that are identical to their respective counterparts in FIG. 6 are denoted by the same reference numerals. In the following, the points that distinguish the second embodiment from the first embodiment will be mainly described. The sense-amplifier control circuit of FIG. 8 differs from that of FIG. 6 in the internal configuration of the discharging circuit 2. The discharging circuit 2 of FIG. 8 only includes the first discharge path 11 and the second discharge path 12. To be more specific, the discharging circuit 2 of FIG. 8 includes the first discharge path 11 including the transistors Q31 and Q33, both of which are cascadingly connected to each other, and the second discharge path 12 including the transistor Q31, a resistor 45, and the transistor Q34, all of which are cascadingly connected to one another. To put it differently, the discharging circuit 2 of FIG. 8 replaces the transistor Q32 of FIG. 6 with the resistor 45, and eliminates the delay inversion circuit 43 and the transistor Q35.

Figure 9:
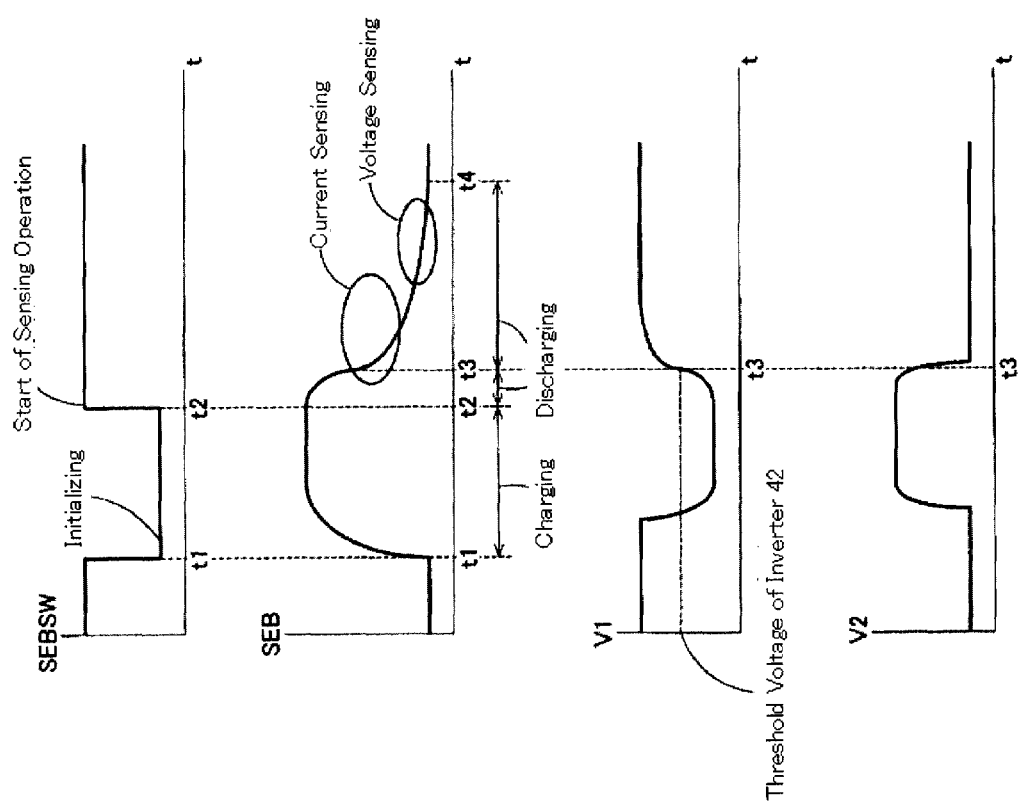
FIG. 9 illustrates voltage-waveform charts for various points indicated in FIG. 8.

FIG. 9 illustrates voltage-waveform charts for various points indicated in FIG. 8, and the vertical axes and the horizontal axes thereof are the same as those in FIG. 7. By referring to FIG. 9, a description will be given of the operation of the sense-amplifier control circuit shown in FIG. 8, while focusing on the difference from that in FIG. 6.

When the SEBSW signal is initialized to be low (at time t1), the SEB signal becomes high so as to have an initial voltage (during charging period t1 to t2). If, at time t2, the SEBSW signal is changed to be high, the current flows through the first discharge path 11, so that the voltage level of the SEB signal is lowered relatively rapidly (during discharging period t2 to t3). When the SEB signal is lowered down to an intermediate voltage between the high level and the low level, the logic of the signal V2 output from the inverter 42 is inverted to be low. Accordingly, the transistor Q33 is turned off. Thus, the first discharge path 11 is cut off. The part of the operation described thus far is the same as its counterpart of the sense-amplifier control circuit shown in FIG. 6.

Then, instead of flowing through the transistor Q33, the current that flows through the transistor Q31 flows through the resistor 45 and the transistor Q34 in the second discharge path 12. While the voltage level of the SEB signal is at approximately the intermediate voltage between the high level and the low level, the sense amplifier performs the current sensing. The second discharge path 12 is formed of the transistor Q31, the resistor 45, and the transistor Q34, all of which are connected in series, so that the current that flows therethrough is not very large. Consequently, the voltage level of the SEB signal is relatively gradually lowered (during discharging period t3 to t4).

Then, when the voltage level of the SEB signal gets close to the low level, the sense amplifier performs the voltage sensing.

As described above, even the simplified circuit configuration of the second embodiment of FIG. 7 with lesser discharge paths than that of the first embodiment can secure a sufficient current-sensing period as in the case of the first embodiment. Accordingly, even the simple circuit configuration of the second embodiment can reliably prevent operation errors of the sense amplifier from taking place. In addition, according to the second embodiment, the number of components of the circuit can be reduced and the power consumption can be reduced, as well.

In the control of a sense amplifier with equalizing function according to a third embodiment of the present invention, an equalization period of a sufficient length is secured before the sensing operation.

Figure 10:
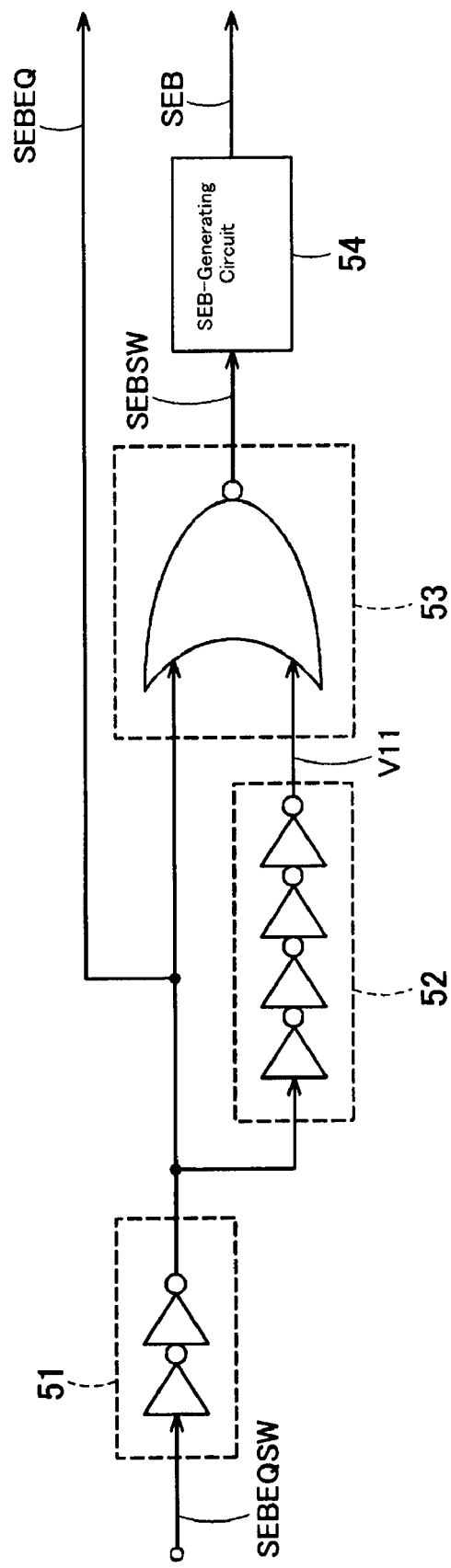
FIG. 10 is a diagram illustrating a general configuration of a sense-amplifier control circuit according to a further embodiment of the present invention.

FIG. 10 is a diagram illustrating a general configuration of a sense-amplifier control circuit according to the third embodiment of the present invention. The sense-amplifier control circuit shown in FIG. 10 generates, for example, an SEBEQ signal (equalization control signal) and an SEB signal supplied to the sense amplifier shown in FIG. 3. In the following, the points that distinguish the third embodiment from the first embodiment will be mainly described.

The sense-amplifier control circuit shown in FIG. 10 includes: an SEBEQ-generating circuit 51 that includes inverters of an even number of stages; an SEBEQ delay circuit (equalization delay circuit) 52 that includes inverters of an even number of stages; an SEBSW-generating circuit (adjustment-signal control circuit) 53 that includes an NOR circuit; and an SEB-generating circuit 54. The SEB-generating circuit 54 has a configuration that is similar to the configuration of either the sense-amplifier control circuit shown in FIG. 4 to FIG. 6 or the sense-amplifier control circuit shown in FIG. 8. To put it differently, the configuration of the sense-amplifier control circuit of the third embodiment is formed by adding the SEBEQ-generating circuit 51, the SEBEQ delay circuit 52, and the SEBSW-generating circuit 53 to the configuration of the sense-amplifier control circuit of either the first embodiment or the second embodiment. The following description is based on an example in which the SEB-generating circuit 54 is the sense-amplifier control circuit of the first embodiment shown in FIG. 6.

The SEBEQ-generating circuit 51 receives an SEBEQSW signal and outputs an SEBEQ signal. The SEBEQ signal is supplied to the sense amplifier and is input into the SEBEQ delay circuit 52 and into the SEBSW-generating circuit 53. The SEBEQ delay circuit 52 outputs a signal V11 obtained by delaying the SEBEQ signal by a predetermined delay time $\tau 2$ (equalization delay signal). The SEBSW-generating circuit 53 outputs the NOR operation result of the SEBEQ signal and the signal V11 as an SEBSW signal (a control signal for the SEB-generating circuit 54). The SEB-generating circuit 54 outputs an SEB signal in response to the SEBSW signal. The SEB signal is supplied to the sense amplifier.

Figure 11:
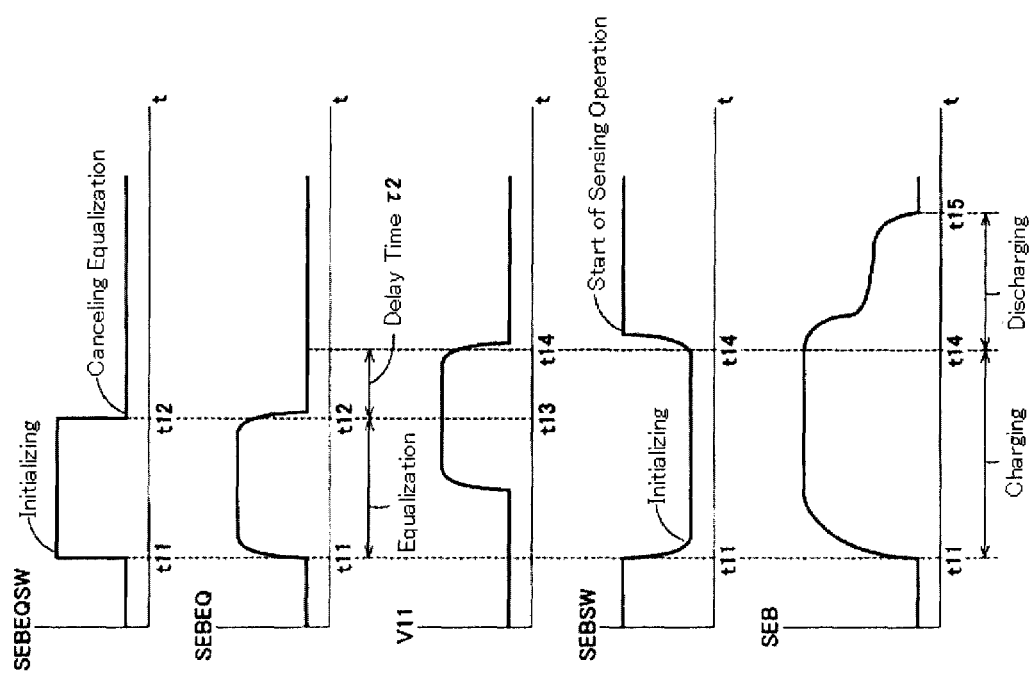
FIG. 11 illustrates voltage-waveform charts for various points indicated in FIG. 10.

FIG. 11 illustrates voltage-waveform charts for various points indicated in FIG. 10. The horizontal axis of each graph in FIG. 11 represents time whereas the vertical axes of the graphs represent the voltage levels for their respective points. The operation of the sense-amplifier control circuit shown in FIG. 10 will be described below by referring to FIG. 11.

To begin with, the SEBSW signal is initialized to be high (at time t11), the SEBEQ-generating circuit 51 changes the SEBEQ signal to be high and the sense amplifier performs equalization (during equalization period t11 to t12). Then, when the SEBEQSW signal is changed to be low (at time t12), the SEBEQ signal is changed to be low, so that the equalization is cancelled.

While the SEBEQ signal is high, the SEBSW signal output from the SEBSW-generating circuit 53 is low. Accordingly, as described in the first embodiment, the SEB signal becomes high so as to have an initial voltage (during charging period t11 to t14). In this way, while the sense amplifier is performing the equalization, SEB signal is set to be high and no sensing operation is performed. Consequently, it is possible to secure the equalization period of a sufficient length.

After a delay time $\tau 2$ has elapsed since the SEBEQ signal became low, the signal V11 output from the SEBEQ delay circuit 52 is changed to be low (at time t14). Then, both of the input signals of the SEBSW-generating circuit 53—specifically, the SEBEQ signal and the signal V11—are changed to be low, so that the SEBSW signal is changed to be high. Accordingly, the SEB-generating circuit 54 starts the sensing operation and the operation described in the first embodiment is performed to lower the voltage level of the SEB signal by three steps (during discharging period t14 to t15)

Note that the length of the delay time $\tau 2$ can be adjusted by, for example, forming the SEBEQ delay circuit 52 with an appropriate number of CMOS-inverter stages. In this way, an appropriate delay time can be set for cancelling the equalization before starting the sensing operation.

As just described above, in the third embodiment, the SEBEQ-generating circuit 51 performs, firstly, the equalization of the sense amplifier with an equalizing function. Then, after the equalization is cancelled, the SEB-generating circuit 54 starts the sensing operation. To put it differently, the SEBEQ delay circuit 52 allows the sensing operation to be started only after the equalization of the sense amplifier is finished. Accordingly, the third embodiment can not only have the same effects as those obtained in the first embodiment but also secure an equalization period of a sufficient length. Consequently, operation errors of the sense amplifier can be prevented and the high-speed operation of the sense amplifier can be accomplished.

The sense-amplifier control circuits shown in FIG. 6, FIG. 8, and FIG. 10 are some examples of the present invention. Various modifications can be made. For example, at least a part of the MOS transistors may be replaced with other kinds of semiconductor elements such as bi-polar transistors or Bi-CMOSs. The sense-amplifier control circuit may have a configuration in which each of the MOS transistors has the opposite conductive type to that in the above-described examples and thereby the connecting positions of the power-supply terminal and of the ground terminal are switched. In this case, the charging timing and the discharging timing of the SEB signal are switched from the case of the above-described circuits. In addition, it is necessary to make such modifications as providing a charge adjusting circuit in place of the discharge adjusting circuit 3. The basic operational principle of this modified sense-amplifier control circuit, however, is the same as that of the above-described examples.

The description of each of the above-described embodiments is based on an example in which the sense amplifier and the sense-amplifier control circuit are independent of each other. Alternatively, the sense amplifier and the sense-amplifier control circuit may be formed as an integral unit. To put it differently, a sense amplifier having a built-in sense-amplifier control circuit with the above-described configuration may be formed on the same semiconductor substrate.

On the basis of the description given above, those skilled in the art may think of various additional effects of the present invention or various modifications. The above-described embodiments, however, are not the only possible forms to carry out the present invention. Various additions, modifications, partial omissions are possible without departing from the concept and the gist of the present invention, which are understood in view of the contents defined in the scope of claims and their respective equivalents.

While the invention is subject to various modifications and alternative forms, specific embodiments thereof are shown by way of embodiments in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

The invention claimed is:

1. A sense amplifier control circuit comprising:
    an initial-voltage setting circuit configured to set a control signal to an initial voltage, the control signal controlling a sensing operation of a sense amplifier; and
    a control-signal-level adjusting circuit configured to first change a voltage level of the control signal from the initial voltage to a voltage level at which the sense amplifier can execute a current sensing, and is configured, after a predetermined time elapses from the first change, to second change the voltage level at which the sense amplifier can execute the current sensing to a voltage level at which the sense amplifier can execute a voltage sensing, wherein the control-signal-level adjusting circuit comprises:
a first path configured to change a voltage level of the control signal from the initial voltage to a first voltage level at which the sense amplifier can execute the current sensing;
a second path configured to change the voltage level of the control signal from the first voltage level to a second voltage level, during which change the current sensing is executed for a predetermined time; and
a third path configured to change the voltage level of the control signal from the second voltage level to a third voltage level at which the sense amplifier can execute the voltage sensing; and
wherein:
the first path is configured to change the voltage level of the control signal more rapidly than in the second path,
the second path is configured to change the voltage level of the control signal more gradually than in the first path, and
the third path is configured to change the voltage level of the control signal more rapidly than in the second path.

2. The circuit according to claim 1,
further comprising:
an adjusting circuit configured to generate first and second adjustment signals that can control operations of the first, second, and third paths; and
wherein:
the first path includes a first transistor configured to change the voltage level of the control signal according to the first adjustment signal,
the second path includes an impedance element configured to change the voltage level of the control signal more gradually than in the first path,
the third path includes a second transistor configured to change the voltage level of the control signal according to the second adjustment signal, and
the adjusting circuit includes a delay circuit configured to generate the second adjustment signal by delaying the first adjustment signal, and is configured to turn on the first transistor earlier than the second transistor according to the first and second adjustment signals so as to execute in order the first path, the second path, and the third path.

3. The circuit according to claim 2,
wherein the impedance element comprises a third transistor.

4. The circuit according to claim 2,
wherein:
the first path includes a third transistor, and the first transistor and the third transistor are connected in series between the initial-voltage setting circuit and a ground;
the second path includes a fourth transistor and a fifth transistor, and the third transistor, the fourth transistor, and the fifth transistor are connected in series between the initial-voltage setting circuit and the ground; and
the second transistor, the third transistor, and the fourth transistor are connected in series between the initial-voltage setting circuit and the ground.

5. The circuit according to claim 1, further comprising:
an adjusting circuit configured to generate first adjustment signals that can control operations of the first and second paths; and
wherein:
the first path includes a first transistor configured to change the voltage level of the control signal according to the first adjustment signal,
the second path includes an impedance element configured to change the voltage level of the control signal more gradually than in the first path.

6. The circuit according to claim 5,
wherein the impedance element comprises a resistor.

7. The circuit according to claim 5,
wherein:
the first path includes a second transistor, and the first transistor and the second transistor are connected in series between the initial-voltage setting circuit and a ground; and
the second path includes a third transistor, and the second transistor, the impedance element, and the third transistor are connected in series between the initial-voltage setting circuit and the ground.

8. The circuit according to claim 1,
further comprising:
an equalization delay circuit configured to generate an equalizing delay signal delaying an equalizing control signal of the sense amplifier; and
an adjustment signal control circuit configured to control a logic of the first adjustment signal according to the equalizing delay signal and the equalizing control signal so that the sense amplifier starts the sensing operation after an equalizing operation of the sense amplifier.

9. The circuit according to claim 8,
wherein:
the equalization delay circuit and the adjustment signal control circuit include even numbers of inverters, respectively.

10. A controlling method of a sense amplifier comprising:
setting in the sense amplifier a control signal to an initial voltage, the control signal controlling a sensing operation of a sense amplifier;
first changing a voltage level of the control signal from the initial voltage to a voltage level at which the sense amplifier can execute a current sensing; and
second changing, after a predetermined time elapses after the first changing, the voltage level at which the sense amplifier can execute the current sensing to a voltage level at which the sense amplifier can execute a voltage sensing,
wherein:
the first changing changes the voltage level of the control signal from the initial voltage to a first voltage level at which the sense amplifier can execute the current sensing in a first path, and
the second changing changes the voltage level at which the sense amplifier can execute the current sensing from the first voltage level to a second voltage level, during which changing the current sensing is executed for a predetermined time in a second path; and
the second changing changes the second voltage level at which the sense amplifier can execute the current sensing to a third voltage level at which the sense amplifier can execute the voltage sensing in a third path;
wherein:
the first path is configured to change the voltage level of the control signal more rapidly than in the second path, the second path is configured to change the voltage level of the control signal more gradually than in the first path, and the third path is configured to change the voltage level of the control signal more rapidly than in the second path.

11. The method according to claim 10, further comprising:

equalizing the sense amplifier according to an equalizing control signal after the setting the control signal to the initial voltage.

12. The method according to claim 11, further comprising:

canceling the equalizing the sense amplifier after a predetermined time.

* * * * *